United States Patent [19]
Xu et al.

[11] Patent Number: 5,650,758
[45] Date of Patent: Jul. 22, 1997

[54] PIPELINED DIGITAL PREDISTORTER FOR A WIDEBAND AMPLIFIER

[75] Inventors: Xiangqing Xu, Corvallis; James H. Herzog, Monmouth; Robert S. Larkin, Corvallis, all of Oreg.

[73] Assignee: Radio Frequency Systems, Inc., Marlboro, N.J.

[21] Appl. No.: 563,613

[22] Filed: Nov. 28, 1995

[51] Int. Cl.[6] ................................................ H03F 1/26
[52] U.S. Cl. .................................................... 330/149
[58] Field of Search ............................... 330/107, 129, 330/149, 151; 332/123, 124, 159, 160

[56] References Cited

U.S. PATENT DOCUMENTS

| 5,123,031 | 6/1992 | Kuisma | 375/60 |
| 5,266,906 | 11/1993 | Inahashi | 330/149 |
| 5,351,016 | 9/1994 | Dent | 332/123 X |
| 5,485,120 | 1/1996 | Anvari | 330/149 X |

FOREIGN PATENT DOCUMENTS 2239770  7/1991  United Kingdom .

OTHER PUBLICATIONS

"Adaptive Linearisation Using Pre-Distortion" by Michael Faulkner, IEEE CH 2846–Apr. 1990, pp. 35–40.

"Linear Amplication for Digital Mobile Communications" by Yoshinori Nagata, IEEE CH 2379–Jan. 1989, pp. 159–164.

"Digital Modulation/Demodulation Techniques for Mobile Radio Communications in Japan", The Transactions of the Institute of Electronics & Communications Engineers of Japan, Section E., vol. E74 No. 6, Jun. 1991, pp. 1503–1511, Tokyo, Japan.

*Primary Examiner*—Steven Mottola
*Attorney, Agent, or Firm*—Ware, Fressola, Van Der Sluys & Adolphson LLP

[57] ABSTRACT

An apparatus for linearizing the output of a wideband amplifier by digitally predistorting the input to the amplifier in a way that just compensates for the distortion in the amplified signal, comprising a pipeline controller (12), for providing pipeline controller signals, and a pipelined predistorter (11), consisting of several stations, serially connected to each other, wherein each station performs one or more tasks concurrently, under the direction of the pipeline controller (12). The result is a digital predistorter with a bandwidth large enough to linearize, by itself, the entire output of a wideband amplifier. More generally, an apparatus for linearizing a wideband amplifier by using digital signal processing performed using a pipeline architecture, as opposed to using a sequential processing architecture, under the supervision of a pipeline controller.

11 Claims, 7 Drawing Sheets

PIPELINED DIGITAL PREDISTORTER FOR A WIDEBAND AMPLIFIER

TECHNICAL FIELD

The present invention relates to wideband amplifiers, and more particularly to wideband radio frequency (RF) amplifiers in which the original input is predistorted to make the amplified output vary more nearly linearly with the original input.

BACKGROUND OF THE INVENTION

Depending on the application, radio frequency (RF) amplifiers can be classified as low noise, low power receiver amplifiers, or as high power transmitter amplifiers. The receiver amplifier is designed to process weak signals. For high power transmitter amplifiers, noise is of minor interest since the transmitted signal is usually known and its amplitude can be controlled. What is more important for high power transmitter amplifiers is efficiency. To obtain high efficiency, power amplifiers are operated near saturation. Unfortunately, when operated at saturation, the output of any amplifier is distorted because the gain decreases from what it is for inputs of smaller amplitude. In fact, at saturation—when the input to be amplified is of large amplitude—both the amplitude and phase of the output signal are distorted. The output at saturation is not amplified as much as for smaller amplitude inputs, and there is a slightly longer delay before the amplified signal is produced, as compared to the delay for smaller amplitude inputs; i.e. the output is phase-shifted. Both of these two effects distort the signal, and this distortion is especially of concern in telecommunications.

In the current US cellular band, there are two 25 MHz frequency bands allocated for cellular phones: the frequency band 824 MHz to 849 MHz is for mobile transmission and the 869 MHz to 894 MHz band is for base station transmission. Each of these 25 MHz bands is split into 832 channels, which are each 30 kHz wide. An amplifier in a cellular system can amplify a single channel, in which case it is called a narrow-band amplifier, or the entire 25 MHz band of 832 channels, in which case it is called a wideband amplifier. Depending on the architecture, the amplifier may shift the 25 MHz spectrum from the high frequency band (869–894 MHz) to the 0–25 MHz frequency band—called the baseband—and then process the signal.

If the input to an amplifier drives it to saturation so that it behaves non-linearly, several undesirable consequences result. First, the signal being amplified is distorted. Next, if the amplifier is a narrow-band amplifier, signals from amplifiers for adjacent channels will be affected. And finally, if the amplifier is a wideband amplifier, not only will the signal on each channel be distorted, but its distortion will add to the distortion of other signals it is amplifying, on other channels. (This last effect is called intermodulation distortion.) It is therefore of great interest, in some important applications such as cellular communications, to keep the output of an amplifier as near to a scaled up version of the input as possible, i.e. a linear function of the input.

The simplest way of ensuring this linear behavior is to operate the amplifier far below saturation. The disadvantage is lower power efficiency due to the relatively high quiescent bias voltage of such an amplifier as compared to the voltage for an amplifier operating at saturation. In general, if a power amplifier is operated at a power level where it is linear, it is power inefficient; if it is power efficient, it is normally not linear. The challenge is to maintain, simultaneously, linearity and power efficiency.

Several approaches to meeting this challenge have already been developed. All of these approaches operate an amplifier near saturation, but compensate for the non-linearity that results in different ways. Some of these approaches are analog and some are digital. The analog methods are fast, and so suitable for use in wideband amplifier systems, but are not as accurate as the digital methods. The digital methods, as they have been implemented so far, are too slow for use in a wideband amplifier system, but are more accurate and can be made to adapt to slow changes in an amplifier's nonlinearity due to aging, temperature changes, and other factors. The single lament over digital methods is that, as implemented so far, these methods are too slow to be used for more than a few 10's of kHz of signal bandwidth.

Among the various methods of correcting for an amplifier's non-linearity when it operates near saturation, some directly manipulate the high frequency RF carrier signal. To work with signals at these high frequencies, analog methods must be used. Feedforward correction and RF predistortion, both analog methods, linearize amplifiers this way.

Other techniques work with the baseband signal, then up-convert it to the RF carrier frequency. Since the signal corrected in these methods—the baseband signal—is at a lower frequency, digital methods can be used, but only for a fraction of the baseband signal, at least as these methods have been implemented so far. Cartesian feedback—a digital method—and digital predistortion are two methods that apply corrections to the baseband signal.

The Cartesian feedback method was designed initially for transmitter amplifiers where the baseband signal is available; it adjusts the baseband signal according to feedback from the output of the amplifier, then up-converts the signal to the RF carrier frequency for transmission. It makes use of a quadrature representation of the signal being amplified. In such a representation, a signal X(t) modulated by a carrier frequency $\omega_c$ is expressed in terms of orthogonal basis functions $\cos(\omega_c t)$ and $\sin(\omega_c t)$ as $$X(t) = I(t) \cos(\omega_c t) + Q(t) \sin(\omega_c t)$$

where the information being communicated is conveyed by the time-dependent coefficients I(t) and Q(t). These coefficients, called the quadrature components, can be asserted to represent rectangular components of a two-dimensional vector. This vector can also be expressed in polar coordinates (ρ, θ) where $$\rho = \sqrt{I^2 + Q^2}$$

$$\theta = \tan^{-1}(Q/I)$$

In Cartesian feedback, the baseband input signal is decomposed into quadrature components, I and Q. A portion of the output signal is demodulated and also decomposed into quadrature components, $I_b$ and $Q_b$, to provide feedback. Then $I_b$ and $Q_b$ are subtracted from the original I and Q input drive signals to generate a loop error signal.

Another way to linearize the amplifier output is by predistorting the input signal prior to amplifying it, making the overall system appear linear. In this method, a so-called predistorter is placed between the input signal and the power amplifier. Most of these predistorter methods can be classified as either RF analog predistortion or baseband digital predistortion.

The RF analog predistorter places a network of active and passive components designed to compensate for the amplifier characteristics between the input signal and the amplifier. Diodes are often used in the network to provide the nonlinear compensation. The correction can be fixed—meaning that once the network is implemented the correction will not change—or adaptive, in the sense that the correction is continually adjusted as the amplifier characteristics change.

RF analog predistortion is suitable for wideband application. Due to the difficulty of designing a circuit that can match the amplifier perfectly, however, the linearization is not as complete as can be achieved using digital signal processing. But to use digital signal processing, the signal must be down-converted to the baseband because digital signal processing equipment today is not fast enough to accurately digitize signals at frequencies in the 10's of MHz.

So digital predistortion first down-converts the signal to be predistorted, applies a predistortion using digital signal processing, and then up-converts the signal for the amplifier. In fixed baseband digital predistortion, the predistortion is not adjusted to account for changes in the non-linearity of the amplifier. In adaptive baseband digital predistortion, the predistortion is continually adjusted based on an error signal determined by comparing feedback from the amplifier with feedforward from the original input signal. To determine how to adjust the predisortion using digital signal processing is a time-consuming process, compared to how long it takes to apply a predetermined predistortion. Therefore, feedback in the baseband digital predistorter is used only for compensating for slow drift of the amplifier, caused by changing temperatures, aging and other factors; it is not used for real-time adjustment of the predistortion values.

There are now several adaptive baseband digital predistortion methods. In one of the most general and powerful methods, the input signal X is represented in quadrature format. The quadrature signals, I and Q, are used as indices into a two-dimensional look-up table holding the predistortion values needed to generate a predistorted signal, $X_d$. The predistorted input signal $X_d$ is also implemented in quadrature format, $I_d$ and $Q_d$. With this method, since I and Q, in combination, carry both amplitude and phase information, the amplifier's nonlinear amplitude and phase characteristics can both be compensated for by using the predistorted input $X_d$.

The number of quantization bits—the resolution of the digital signal—plays an important role in the performance of the system. The more bits, the more precisely the signal is represented, and the better the cancellation of the amplifier nonlinearity. But more bits require a larger look-up table. It is known that 10 quantization bits for each of the two quadrature signals, I and Q, are needed to achieve acceptable nonlinearity correction. For this resolution, the size of the two-dimensional look-up table is 20M bits ($2^{20} \cdot 20$ bits). A predistorter based on this method can be made adaptive, but the adaptation is slower than in other baseband digital predistortion methods because the look-up table is larger.

The other predistorter methods use one or more one-dimensional tables to reduce the look-up time. This is possible because both an amplifier's amplitude and phase distortion depend only on the amplitude of the input signal. Therefore, if the amplitude of the input signal, $\rho$, is extracted from the I-Q representation, then it can be used as an index into both a table for phase correction and another table for amplitude correction, or as an index into one table with complex number corrections providing simultaneously both an amplitude and a phase correction.

The approach described in the preferred embodiment of the present invention uses two one-dimensional look-up tables. The two one-dimensional tables, combined, are much smaller than a single two-dimensional look-up table, so updates to the tables can be applied much faster. This approach, however, does require converting from a rectangular (I and Q) to a polar representation ($\rho$ and $\theta$) of the input to be amplified.

All of these methods of digital baseband predistortion offer more freedom in handling cancellation of nonlinearity than do analog methods, since the cancellation is performed through software. The disadvantage, as these methods have been implemented, is small bandwidth.

Because of the limitation in digital signal processing speed, it is not possible to implement a digital predistorter with a 20 MHz bandwidth using digital signal processing in a conventional, sequential digital signal processing architecture, as in the prior art. For example, suppose a digital predistorter uses a digital signal processor with a 50 MHz clock rate and 12.5 MHz instruction rate and a look-up table. Between every two data samples, the digital signal processor must read data from the look-up table and digitally process it, i.e. perform operations of addition, subtraction or multiplication. Assuming ten instructions are required to process one digitized sample of the input, the fastest data sample rate is 12.5 MHz/10=1.25 MHz. According to the Nyquist sampling theorem, to avoid aliasing, the sample rate must be at least twice the maximum frequency component of the real-time spectrum. With a sample rate of 1.25 MHz, the actual linearized bandwidth is thus limited to 0.625 MHz maximum. Therefore, a sequential digital signal processing implementation using contemporary hardware cannot be used in a wideband amplifier system.

The prior art of digital predistortion is thus all implemented in only narrowband amplifier systems. These digital predistorters all work well for a single channel (10–30 kHz) or a small number of channels in the mobile communication band. When the bandwidth increases to several MHz, however, they do not work fast enough.

SUMMARY OF THE INVENTION

One element of the invention is a digital predistorter for linearizing the output of a power amplifier, as in the prior art, but built in a pipeline architecture so that elements of the system work like workers in an assembly line—all working at the same time but on different parts of consecutive items of manufacture. The second element of the invention is a pipeline controller that ensures that each station of the pipeline executes its tasks concurrently with the other stations. It is, therefore, a means of providing a predistorted signal to an amplifier using digital signal processing, allowing accurate, time-dependent corrections to non-linearity, but overcoming the bandwidth limitations of the prior art by pipelining data samples. Pipelining enables processing at rates fast enough for a baseband digital predistorter to be used in a wideband amplifier system.

An object of the invention is that the pipeline architecture should not be restricted to a particular kind of amplifier or type of modulation. A further object of the invention is to provide accurately predistorted input for an amplifier with a bandwidth of 20–30 MHz, sufficient to cover all of the channels of a base station in a cellular communication system, instead of a single channel or a few adjacent channels. A further object of the invention is that the predistorter should have a simple interface and be controllable by a microcontroller or personal computer.

The invention is both a qualitative as well as quantitative improvement over the prior art, in that the improvement in performance is so drastic, compared to methods based on simple sequential digital signal processing, as to make possible the use of a single predistorter for all channels of a cellular communication system at once. By comparison, a predistorter according to the prior art is capable of handling only a single channel or a few adjacent channels.

BEST MODE FOR CARRYING OUT THE INVENTION

Figure 1:
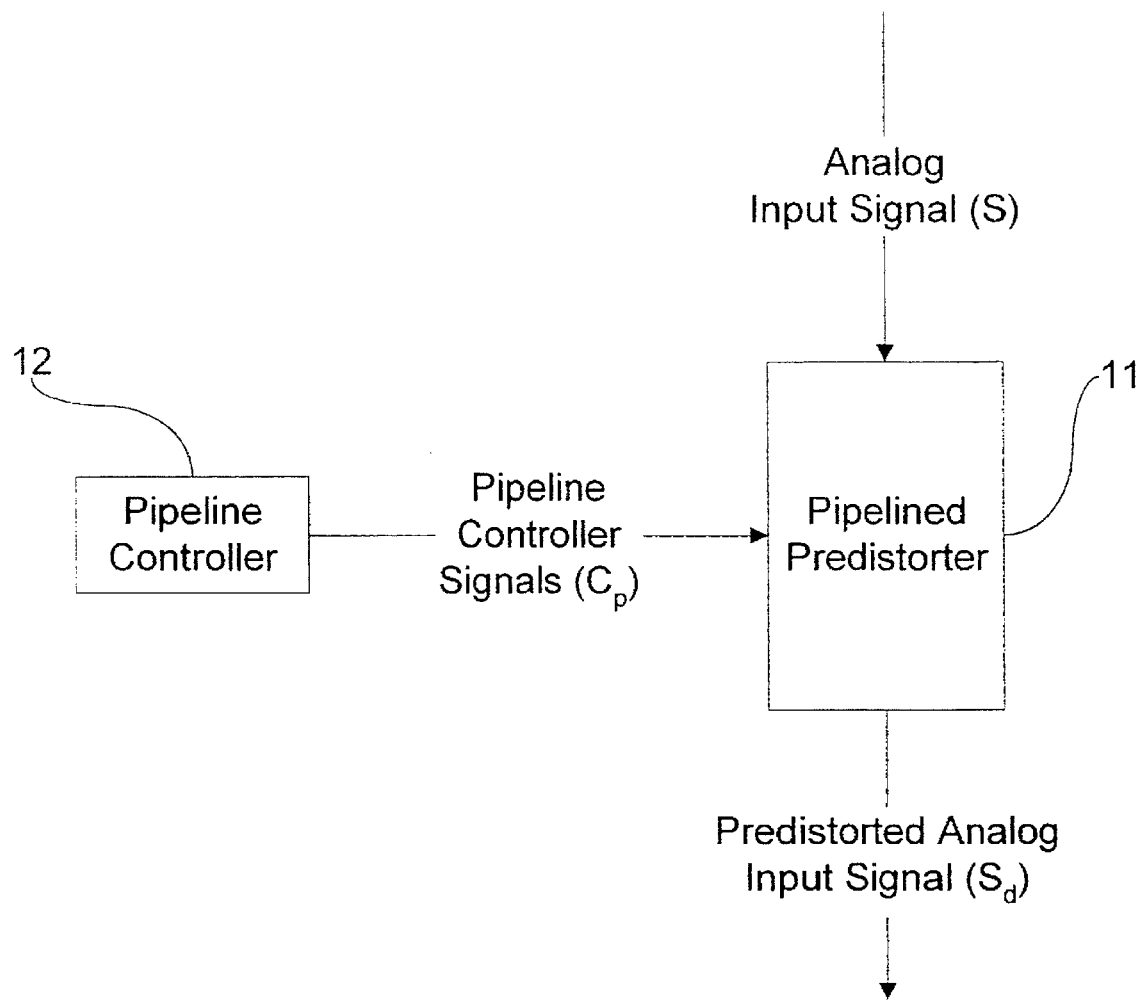
FIG. 1 is a schematic block diagram showing the invention.

In a preferred embodiment of the present invention, the apparatus builds on two fundamental elements: a pipeline controller (12) and a digital pipelined predistorter (11). FIG. 1 shows the pipelined predistorter predistorting an analog input signal (S), under the direction of the pipeline controller (12) communicating through pipeline controller signals ($C_p$). The pipelined predistorter (11) is pipelined in the sense that it comprises several independently operating pieces of signal processing hardware, logically organized into stations, like in an assembly line, each of which performs one or more tasks aimed at predistorting consecutive analog input signals (S). The pipeline controller signals ($C_p$) orchestrate the concurrent operation of each station, thereby providing the predistorted analog input signals ($S_d$) faster, at least after an initial lag between when the first signal arrives and when its predistorted counterpart exits the pipeline, than could be achieved using a sequential processing digital predistorter performing the same kind of predistortion.

Figure 2:
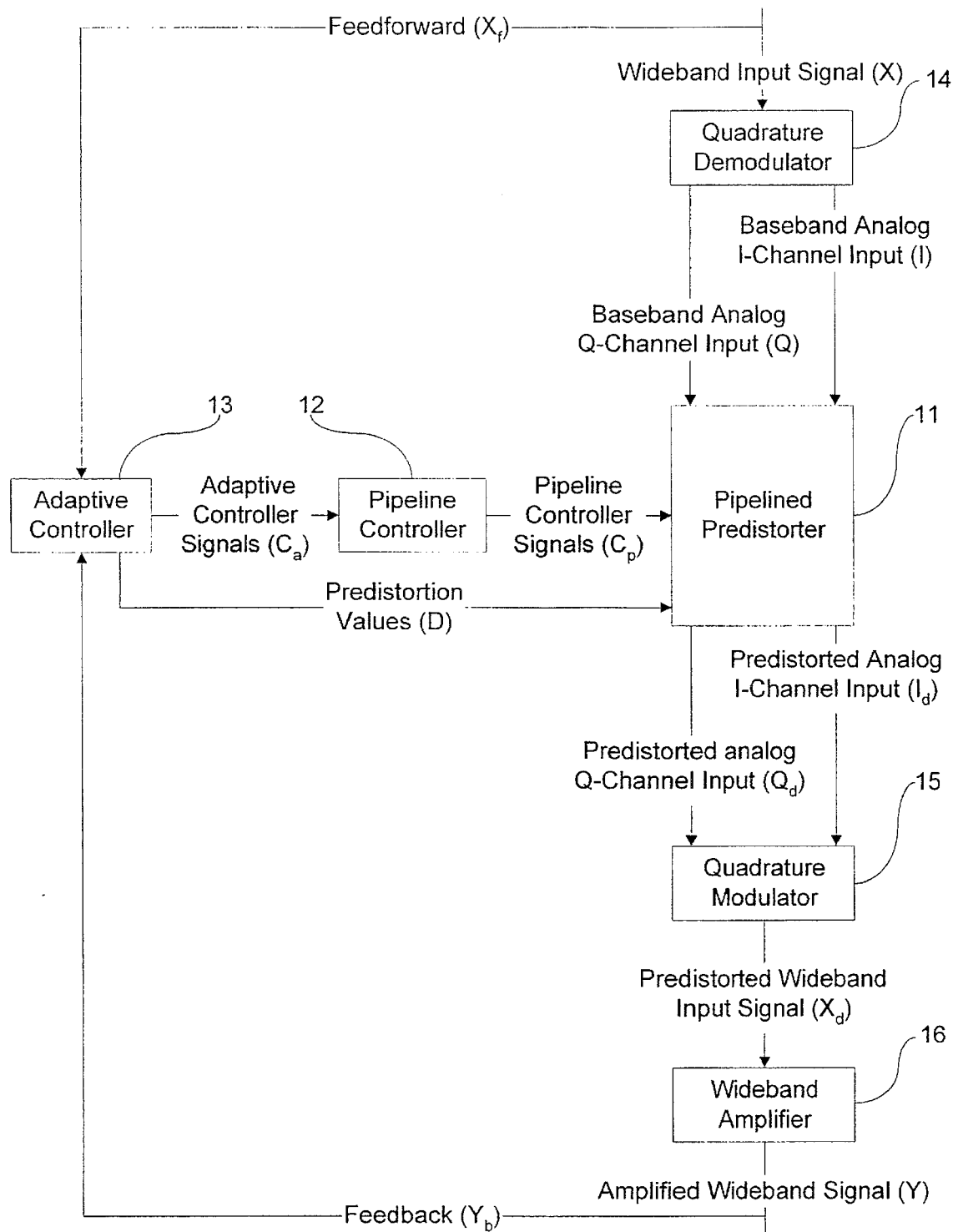
FIG. 2 is a schematic block diagram showing the invention used to predistort signals input to a wideband RF amplifier.

FIG. 2 shows the invention used in an application such as a cellular communication base station amplifier system. Here, the analog input signals (S) of FIG. 1 are shown as two input signals: a baseband analog I-channel input (I), and a baseband analog Q-channel input (Q). The predistorted analog input signals ($S_d$) of FIG. 1 are shown as the predistorted counterparts to the two input signals: the predistorted analog I-channel input ($I_d$) and the predistorted analog Q-channel input ($Q_d$). The original input signals result from down-converting and generating in quadrature a representation of the wideband input signal (X), which is the original RF input to the wideband amplifier.

FIG. 2 also shows an adaptive controller (13) that compares a feedback ($Y_b$) of the amplified wideband signal (Y) with a feedforward ($X_f$) of the wideband input signal (X). As the wideband amplifier (16) ages, or, more often, as it heats up or cools back down, its nonlinear behavior changes. The adaptive controller (13) senses any change in nonlinearity and adjusts how the input is predistorted by slowly adjusting predistortion values (D) used by the pipelined predistorter (11), thus keeping the deviation from linearity small. It does this by slowly updating, based on some algorithm, the predistortion values (D) in a second, inactive look-up table in the pipelined predistorter (11). When it has completed calculating a new set of values, it sends an adaptive controller signal ($C_a$) to the pipeline controller; then the pipeline controller enables the pipelined predistorter to switch from the tables it is using to the updated look-up tables.

To cause any effect in the processing of the pipelined predistorter, the adaptive controller (13) interfaces with the pipelined predistorter (11) only through the pipeline controller (12); the adaptive controller however can write to memory tables not being used by the pipelined predistorter without effecting operation so it does that directly, without going through the pipeline controller.

The form the predistortion values (D) take depends on the mathematical model used to represent the output of the amplifier. Since the ideal amplifier is one that is linear, an often-used model for a weakly non-linear amplifier is one in which the output is assumed to be a polynomial of only a few terms, often up to only fifth order, and only including odd powers. In that case, the predistorted input would be modeled in the same way, and the polynomial coefficients of the predistorted input adjusted to wiggle the input curve, i.e. to predistort it, in the same amount but in an opposite sense from how the amplifier will subsequently distort it.

For example, the output of the amplifier may be modeled as $$Y(t) = a_1 \cdot X_d(t) + a_3 \cdot X_d^3(t) + a_5 \cdot X_d^5(t)$$

where $X_d(t)$ is, here, the predistorted input, but could be any input, i.e. the amplifier (16) will behave according to this mathematical model in any case. In those situations in which this model is a good representation, the output of the predistorter (11) would be modeled in the same way:

$$X_d(t) = b_1 \cdot X(t) + b_3 \cdot X^3(t) + b_5 \cdot X^5(t)$$

where $X(t)$ is the input to the predistorter (11), and would be input directly to the amplifier (16) if predistorting were not being done. The coefficients $b_1$, $b_3$, and $b_5$ are chosen to provide that $$Y(t) = c\, X(t)$$

where c is a gain that is constant over as wide a range of input amplitudes as possible.

As has already been explained, however, for large enough input any amplifier distorts both the amplitude and phase from what a pure scaled up version of the input would be. The ideal amplifier, of course, responds with an output that is unchanged in phase relative to the input, and which has an amplitude that is a multiple of the input by a factor that is the same for any input. Thus, in the model using a fifth order polynomial, to account for both phase and amplitude distortion, the coefficients could be taken to be complex, or two polynomials could be used, each with its own set of coefficient for the amplitude, and one for the phase. The embodiment described here employs the second approach: two tables of predistortion values are used—one for the amplitude and one for the phase. Instead of coefficients of polynomials, however, both are tables of actual predistorted values; one is a table of predistorted amplitudes, indexed according to an undistorted input amplitude, and the other is a table of predistorted phase differences—also indexed according to an undistorted input amplitude—which can then be added to the undistorted input phase to give the predistorted input phase.

Figure 3:
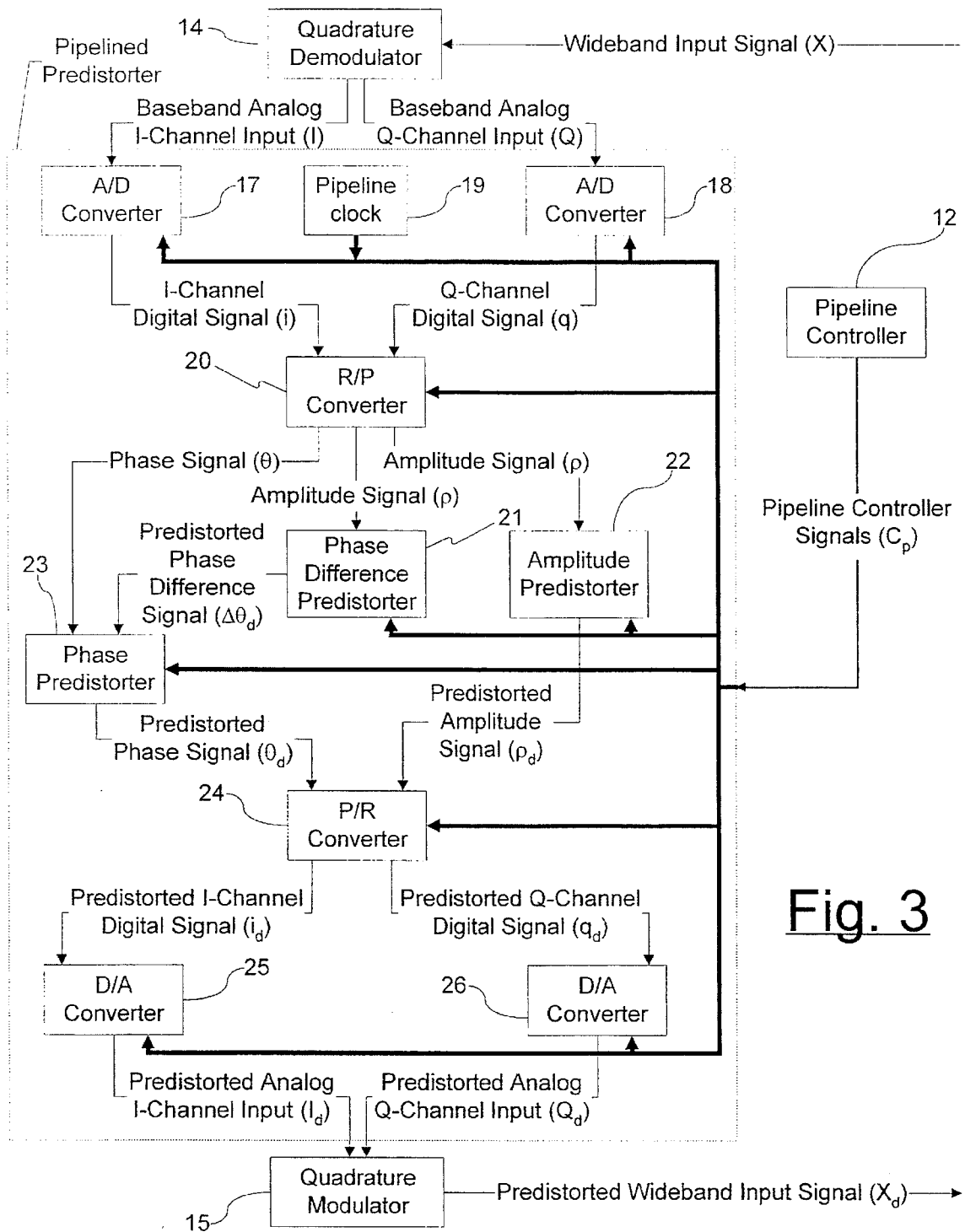
FIG. 3 is a schematic block diagram showing one possible organization of the pipelined predistorter into stations, and the interface of those stations with the pipeline controller.

Referring to FIG. 3, the pipelined predistorter is shown organized into stations in a particular way. There are many possible ways of organizing the digital signal processing tasks required to predistort the amplifier input; FIG. 3 shows just one possibility. The predistorter (11) consists of analog-to-digital (A/D) converters (17 & 18), data processing hardware (20, 21, 22, 23, 24) and digital to analog (D/A) converters (25, 26), as well as data registers for intermediate storage between stations, and finally, an embedded clock (19). According to the Nyquist sampling theorem, for a 25 MHz bandwidth signal, the sample rate must be at least 50 MHz. This means that each station of the predistorter (11) must complete its work within 20 nanoseconds. This is made easier by using two one-dimensional look-up tables, each indexed by the amplitude signal (ρ) derived from the base-band digital quadrature representation of the analog input signal.

In FIG. 3, the pipeline controller (12) is shown providing pipeline controller signals ($C_p$) to each element of the pipeline, simultaneously. In one embodiment, the pipeline controller signals could be generated by a set of three-bit control indicators that affect what is read from a ROM chip in the pipeline controller. The pipeline elements would then read the actual pipeline controller signals ($C_p$) from the ROM at each tick of the embedded pipeline clock (19).

In the embodiment shown in FIG. 3, there are six stations. The first station includes two A/D converters (17 & 18), one for each of the two baseband analog quadrature channel inputs (I, Q). Each A/D converter then generates corresponding digital input signals (i or q). The second station includes an R/P converter (20) that transforms the rectangular representation (i, q) into the polar representation (ρ,θ) where ρ is the amplitude and θ is the phase of digitized input signal. The third station includes a phase difference predistorter (21) that uses the amplitude signal (ρ) as an index into a one-dimensional look-up table to provide a predistorted phase difference signal ($\Delta\theta_d$); this predistorted phase difference is combined in the phase predistorter (23) of the fourth station with the original phase to produce a predistorted phase. The third station also includes an amplitude predistorter (22), which also uses the amplitude signal (ρ) but this time to look up a predistorted amplitude signal ($\rho_d$), which will be used in place of the original amplitude. The fifth station includes a polar to rectangular (P/R) converter (24) for converting to a rectangular representation ($i_d$, $q_d$) the newly predistorted digital signal. The sixth station includes a (D/A) converter (25 & 26) for each predistorted digital signal ($i_d$, $q_d$) to provide a predistorted analog input ($I_d$, $Q_d$). It is this analog signal that is then quadrature modulated and input to the wideband amplifier (16).

Figure 4:
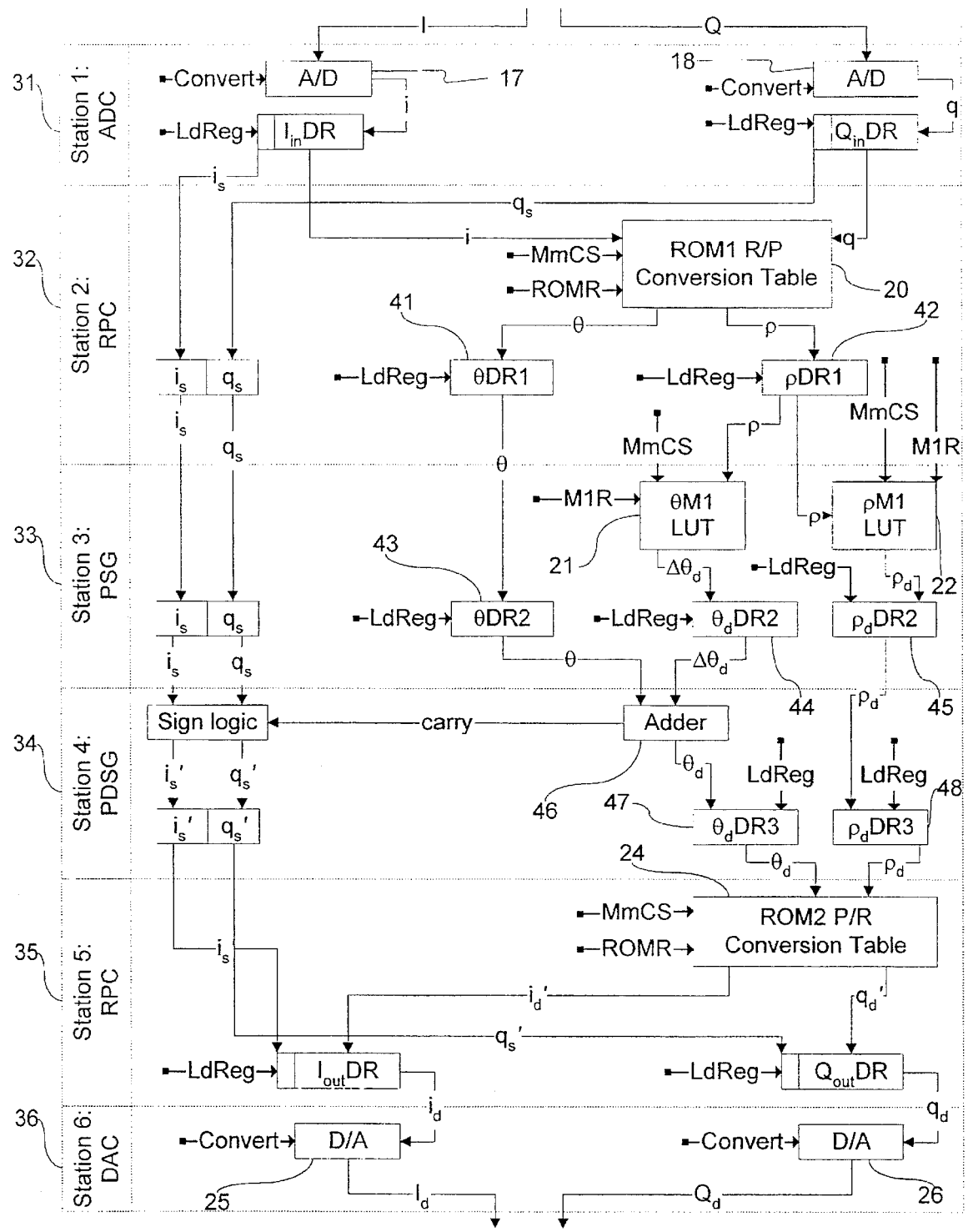
FIG. 4 is a schematic control diagram showing a more detailed decomposition of the pipeline, and the control signals issued to elements of the pipeline.

Referring now to FIG. 4, the embodiment is shown in more hardware detail, but with a different method of determining the predistorted phase signal ($\theta_d$) from what is represented in FIG. 3. Station one (31) performs analog-to-digital conversion (ADC). At least 10 quantization bits are required to achieve adequate resolution. Increasing the number of quantization bits gives more resolution but increases the cost. The digital signals generated by the A/D converters (17 & 18) are stored in data registers which serve as data sources for the next station.

Station two (32) performs rectangular-to-polar conversion (RPC) to obtain the amplitude ρ and phase θ from I and Q by using a two-dimensional look-up table. The input and output relationships of this conversion table are:

$$\rho = \sqrt{I^2 + Q^2}$$

$$\theta = \tan^{-1}(Q/I)$$

where I and Q are the input data, and ρ and θ are the output data from the table. Since the content of the table is fixed, the R/P conversion table can be implemented in ROM. The size of the R/P conversion table is proportional to the number of bits in the I and Q signals. A 10-bit I signal and 10-bit Q signal will result in a 20 Mbit table. The table size can be reduced by keeping track of the quadrant of the IQ-plane where the original I and Q signals are located; the ρ and θ in any quadrant can be calculated knowing ρ and θ in the first quadrant and the signs of the original I and Q signals. This technique decreases the size of the table needed by three-fourths. The embodiment shown in FIG. 4 uses this sign-magnitude method.

With the sign-magnitude method, the sign bit can be used to keep track of the phase while the magnitude bits can be used as the address to access the R/P conversion table. The table is pre-computed, for a presumed range of I and Q. The sign bits from the I and Q signals are not used in this station and are forwarded to the next station. Two data registers, ρDR1 (42) and θDR1 (41), are used to hold the output data from the conversion table.

Station three (33) performs predistorted signal generation (PSG); it generates two predistorted signals, $\rho_d$ and $\Delta\theta_d$, using the amplitude (22) and phase (21) correction tables. These two one-dimensional look-up tables are predetermined according to the amplifier nonlinearity and loaded during initialization. When the amplifier nonlinearity changes, the tables must be updated. These tables can be stored in RAM-type memory. The size of each look-up table can be 512 words for a 9-bit address. The phase (θ) of the original signal is not modified in station three; it is passed on to the next station. The sign values are also passed on without modification.

Station 4 (34) performs the predistorted phase difference signal generation (PDSG). An adder (46) is used to combine the predistorted phase difference signal ($\Delta\theta_d$) from the phase correction table (21) with the original phase (θ), producing a predistorted phase signal ($\theta_d$). This phase is not an absolute phase, however. As already explained, the phase information in the data register θDR2 (43) only reflects the first quadrant phase, i.e. the phase that the input would have if both I and Q were positive. The actual phase can be formed using the value in θDR2 (43) and the sign bits of I and Q. For example, if I and Q are both greater than zero, the actual signal is located in the first quadrant and no correction is required; if I>0 and Q<0, the signal is located in the fourth quadrant, and the real phase is equal to $2\pi$−(content of θDR2).

Even more compactly, however, an absolute predistorted phase is never produced. All that it needed are the correct sign bits for the $I_d$ and $Q_d$ signals. These can be determined from the carry signal from the adder. If a carry occurs, which would mean the predistorted signal is shifted to the next quadrant, then the original signs of $I_s$ and $Q_s$ must be corrected. Logic is used to produce the correct signs, $I_{sd}$ and $Q_{sd}$, from $I_s$, $Q_s$ and the carry. The logic used to infer $I_{sd}$ and $Q_{sd}$ from $I_s$, $Q_s$, and C is:

$I_{sd} = I_s \cdot \bar{C} + C \cdot Q_s$ $Q_{sd} = Q_s \cdot \bar{C} + C \cdot I_s$ The output data from this station are $\rho_d$ and $\theta_d$, which are stored in data registers $\rho_d$DR3 (48) and $\theta_d$DR3 (47).

Station five (35) performs polar-to-rectangular conversion (PRC), using a ROM table (24). Again, sign bits are not used, but instead are appended to the output. The outputs of the table are:

$I_d = \rho_d \cdot \cos(\theta_d)$ $Q_d = \rho_d \cdot \sin(\theta_d)$

Station six (36) performs digital-to-analog conversion (DAC), converting the predistorted digital signals, $I_d$ and $Q_d$, to analog signals using a pair of D/A converters (25 & 26). The analog signals are then up-converted and summed to form an RF drive signal, $X_d$ for the wideband amplifier (16).

Figure 5:
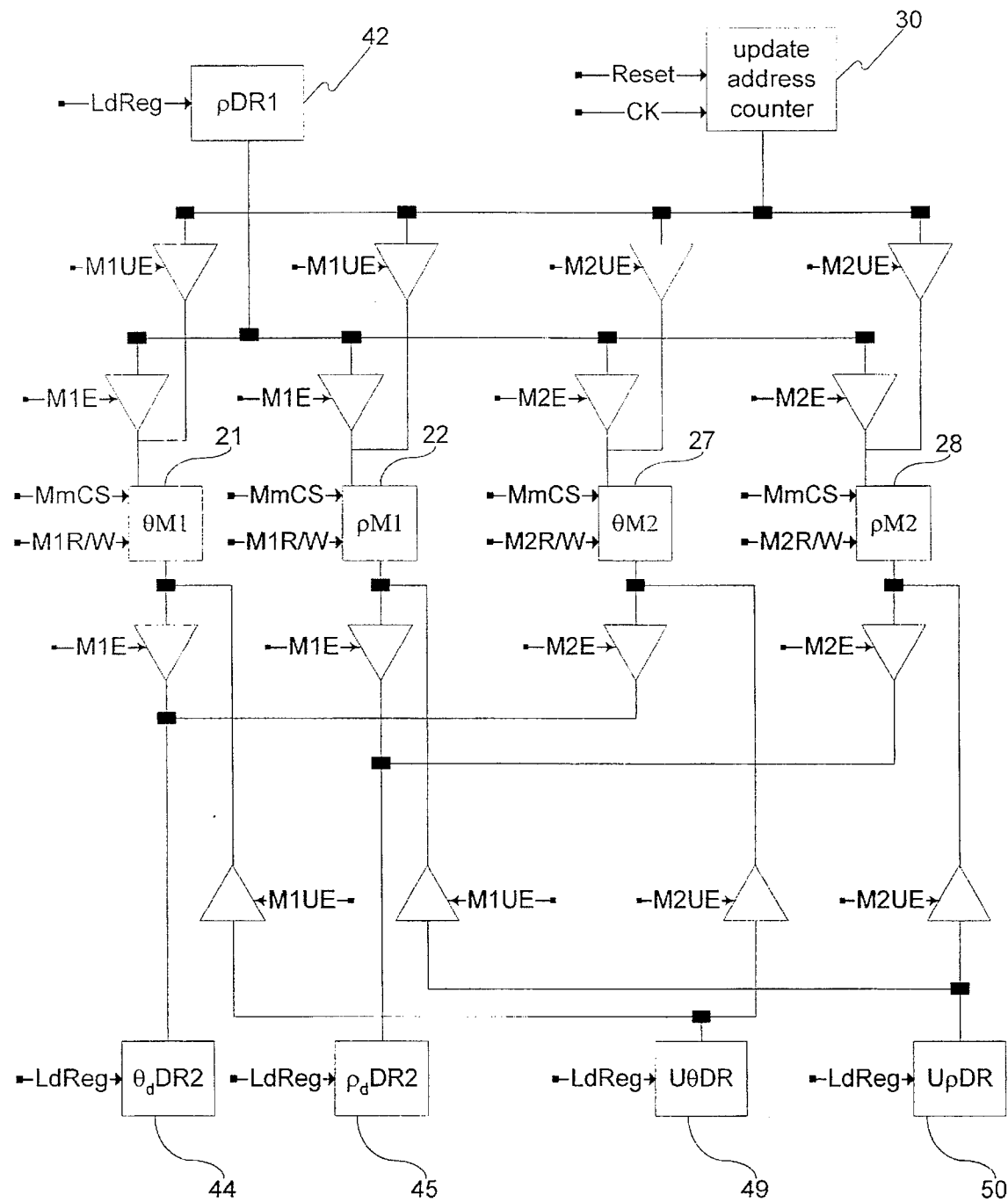
FIG. 5 is a schematic control diagram showing only those elements of the pipeline dedicated to storing and updating the two sets of two look-up tables of predistortion values, one table for the amplitude in each set and one table for the phase.

FIG. 5 shows an arrangement for adapting the predistortion values (D) to account for changes in the amplifier nonlinearity. Because determining new correction factors is time-consuming, two sets of one-dimensional look-up memory tables of predistortion values are used: table-set one consisting of the table $\theta$M1 (21), and $\rho$M1 (22) and table-set two consisting of $\theta$M2 (27) and $\rho$M2 (28). One table-set can be used by the predistorter (11), while the other is updated off-line.

As can be seen from FIG. 5, when table-set one ($\theta$M1, $\rho$M1) is being used for actual data processing, and table-set two ($\theta$M2, $\rho$M2) is being updated, the pipeline controller signal M1E (memory table-set one enable) enables the content of $\rho$DR1 (42) to provide an address to the $\theta$M1 (21) and $\rho$M1 (22) one-dimensional tables of predistortion values. It also creates paths for the predistorted signals, $\rho_d$ and $\Delta\theta_d$, which are output from the tables, to data registers $\rho_d$DPC2 (44) and $\theta_d$DR2 (45). The pipeline controller signal M2UE (memory table-set two update enable) allows data from the update data registers U$\rho$DR (50) and U$\theta$DR (49) to be copied to table-set two. The address to table-set two is generated by the update address counter (30). The update data registers (49, 50) and update address counter (30) are all controlled, indirectly, by the adaptive controller (13) through the adaptive controller signals ($C_a$) it sends to the pipeline controller.

In updating table-set two, the adaptive controller updates the look-up tables (27, 28) by first sending a signal to reset the update address counter (30). It then sends data to the update data registers (49, 50), loads the data to the memory tables (27, 28), advances the update address counter (30), and sends another data unit. It repeats the steps until table-set two is fully updated. Then it sends an adaptive controller signal ($C_a$) to the pipeline controller which then signals the pipelined predistorter (11) to use table-set two, and immediately begins updating table-set one. Thus, update of the look-up tables holding the predistortion values is performed off-line and does not affect processing speed.

Figure 6:
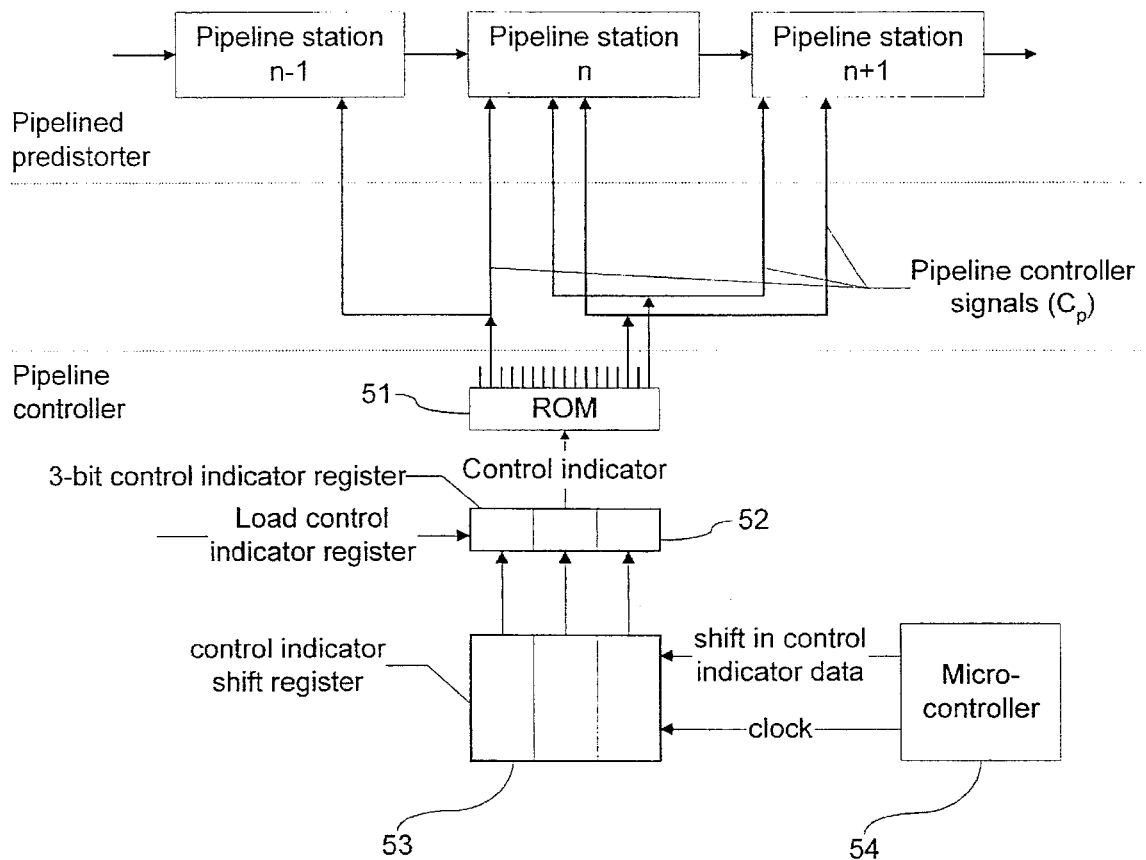
FIG. 6 is a schematic control diagram of a pipeline controller showing how a control indicator might be conveyed to a ROM, from which an associate set of control signals could be read by the pipeline elements.

One embodiment of the pipeline controller (12) is shown in FIG. 6; it includes a 3-bit control indicator register (52), a control indicator shift register (53) from which the control indicator register is loaded, a ROM (51) holding all the different control signals needed to control the pipelined predistorter (11), and a microcontroller (54) that issues the control indicators, as necessary, in step with its own clock, which is different from the clock (19) embedded in the pipeline. In this embodiment only 11 distinct control signals are needed to control every aspect of the pipelined predistorter (11). Table 1 shows the 11 control signals that might be used in this embodiment. Each set of control signals that the 3-bit control indicator specifies includes one or more of these 11 control signals. A ROM of 8×11 bits is large enough to store all the control signals. By using the ROM (51), the pipeline controller (11) can be changed more easily to accommodate changes in the pipeline architecture or components.

To control the pipelined predistorter (11), the pipeline controller (12) need not convey its pipeline control indicators as fast as the pipeline elements read control signals from the ROM (51). The pipeline elements will, in general, use the same set of control signals for many cycles of the clock embedded in the pipeline. The pipeline controller (12) will change the state of the ROM (51), and so designate a different set of pipeline controller signals, much more slowly than the pipeline elements will read the control signals from the ROM (51).

TABLE 1

Pipeline controller signals.

| Signal | Name | Function |
| --- | --- | --- |
| 1 | Convert | Perform A/D or D/A data conversion |
| 2 | LdReg | Load register |
| 3 | MemCS | Memory chip select |
| 4 | ROMR | ROM read |
| 5 | M1R/W | M1 read/write |
| 6 | M2R/W | M2 read/write |
| 7 | M1E | Memory table-set one enable |
| 8 | M1UE | Memory table-set one update enable |
| 9 | M2E | Memory table-set two enable |
| 10 | M2UE | Memory table-set two update enable |
| 11 | Reset | Reset all data registers except the update register |

Figure 7:
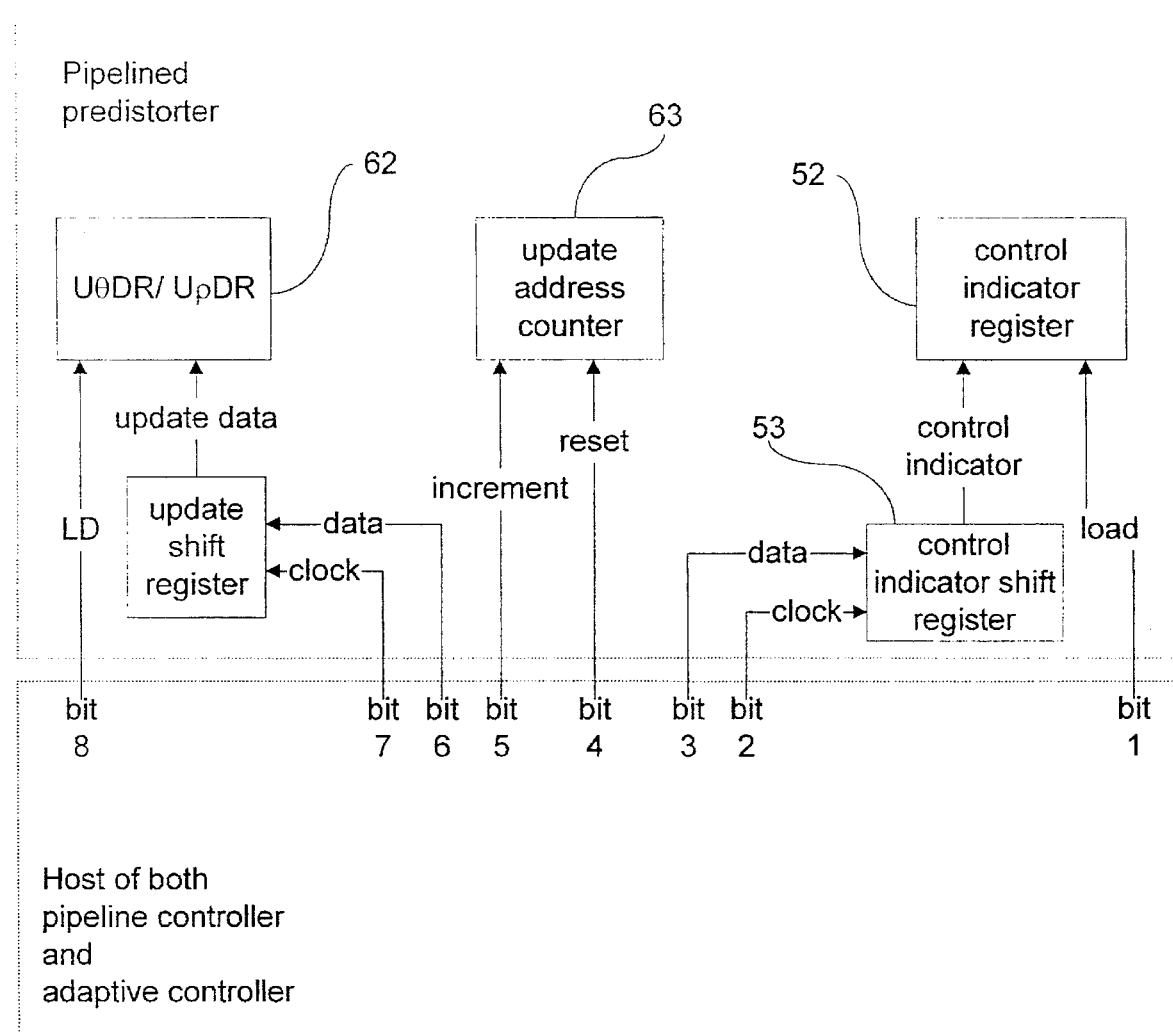
FIG. 7 is a schematic control diagram for an embodiment in which both the pipeline controller and the adaptive controller are implemented using a single microcontroller, showing the interface between that microcontroller and the pipelined predistorter.
Figure 1:
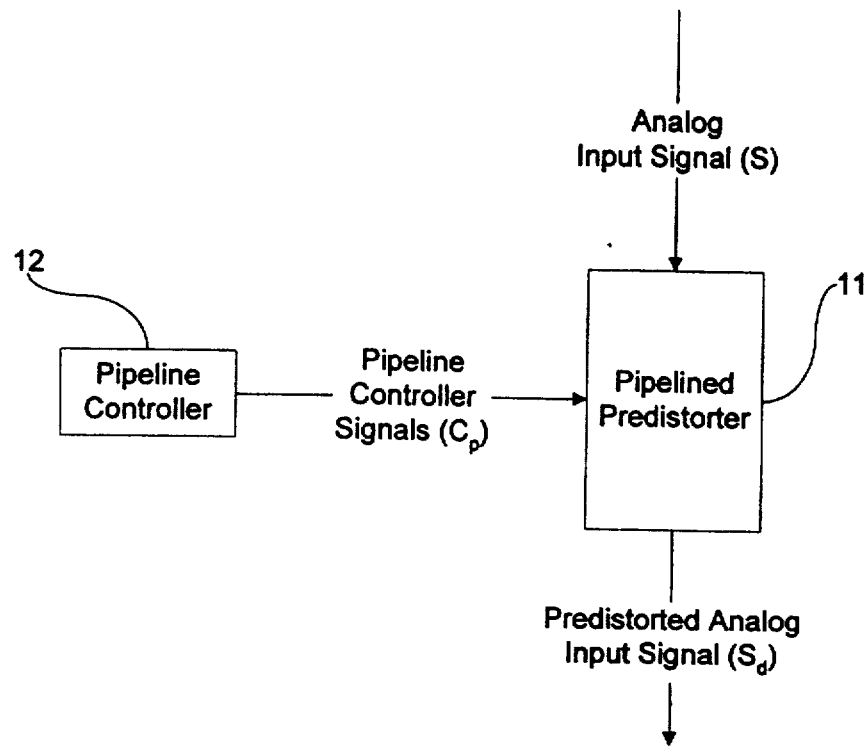
Figure 2:
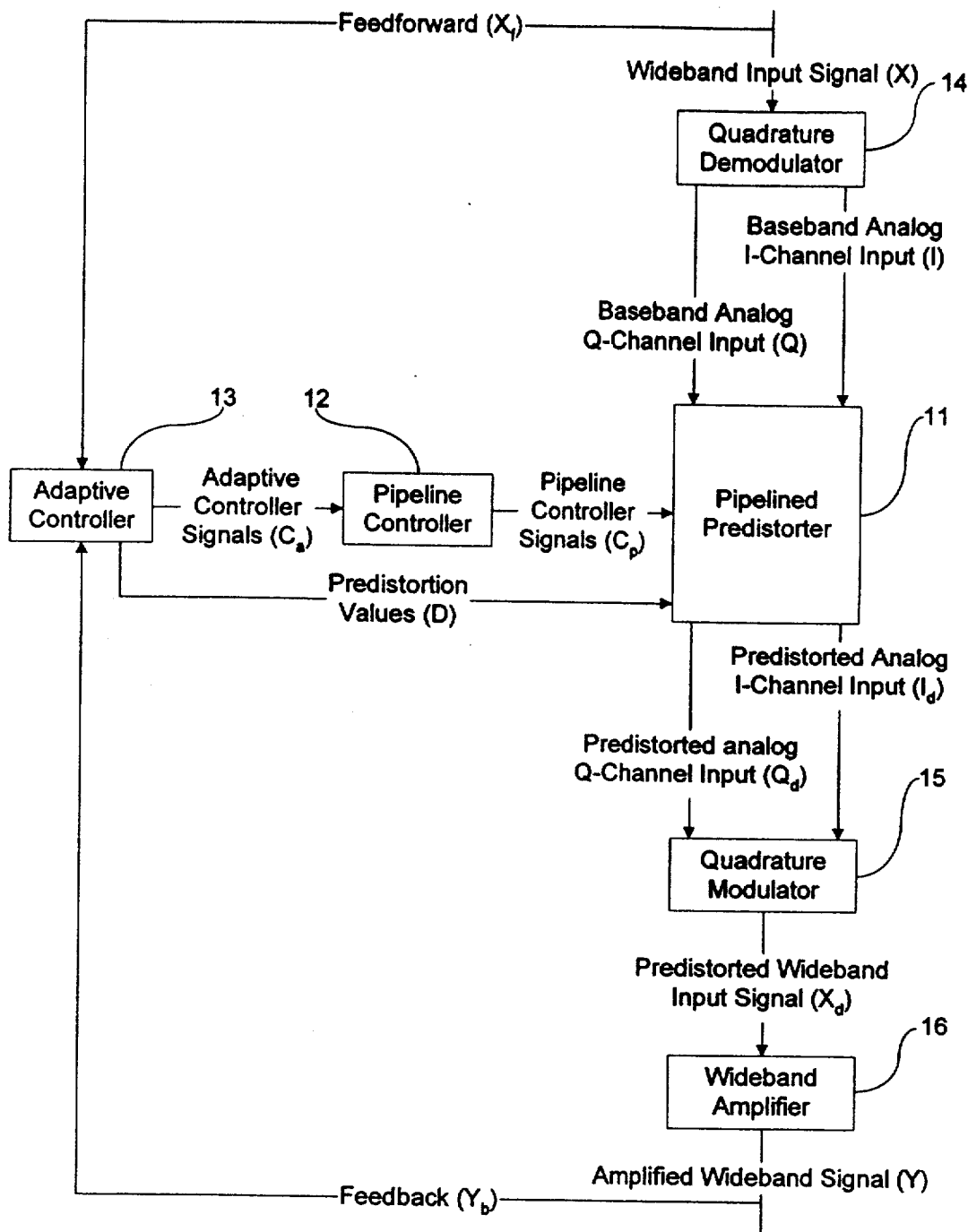
Figure 3:
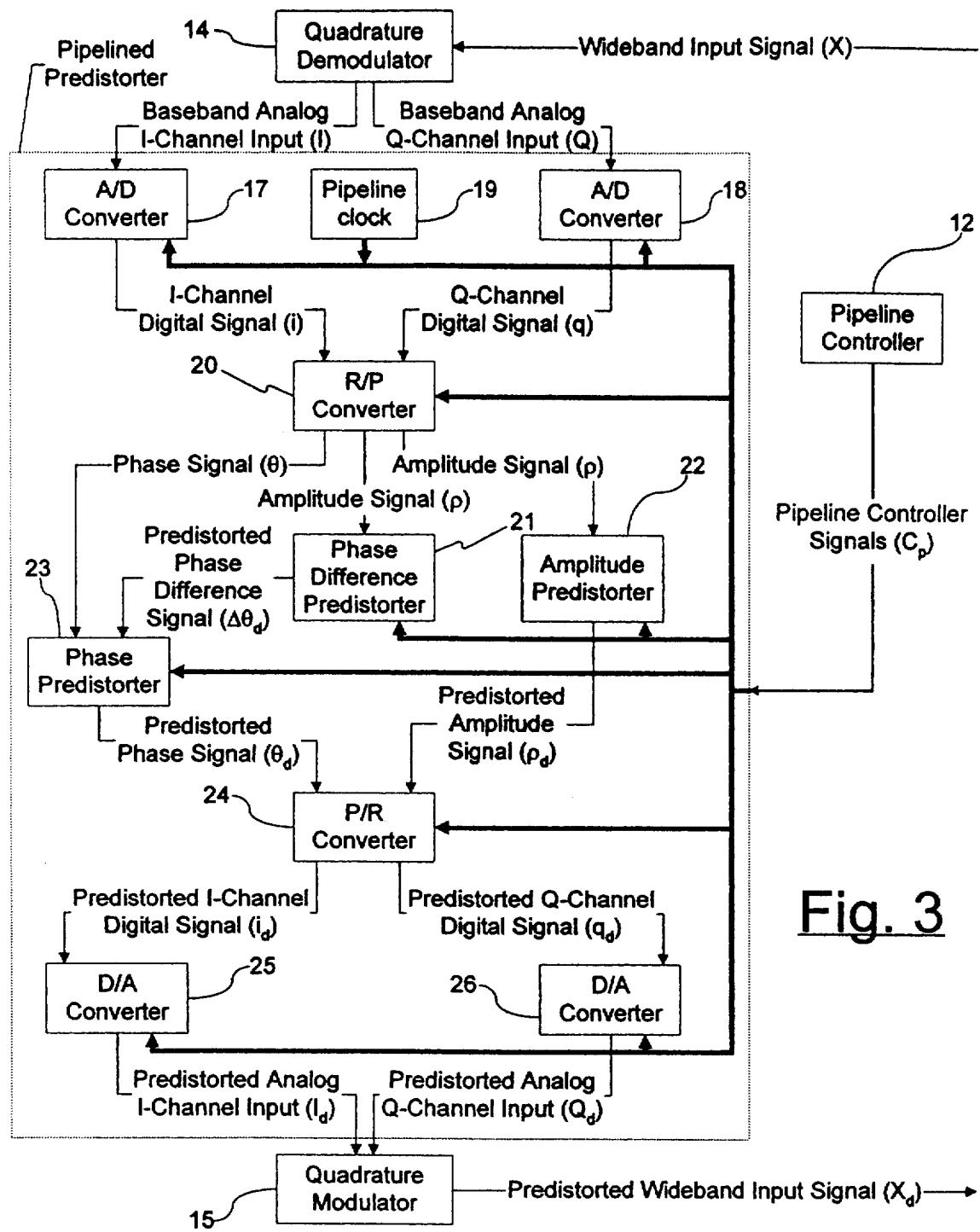
Figure 4:
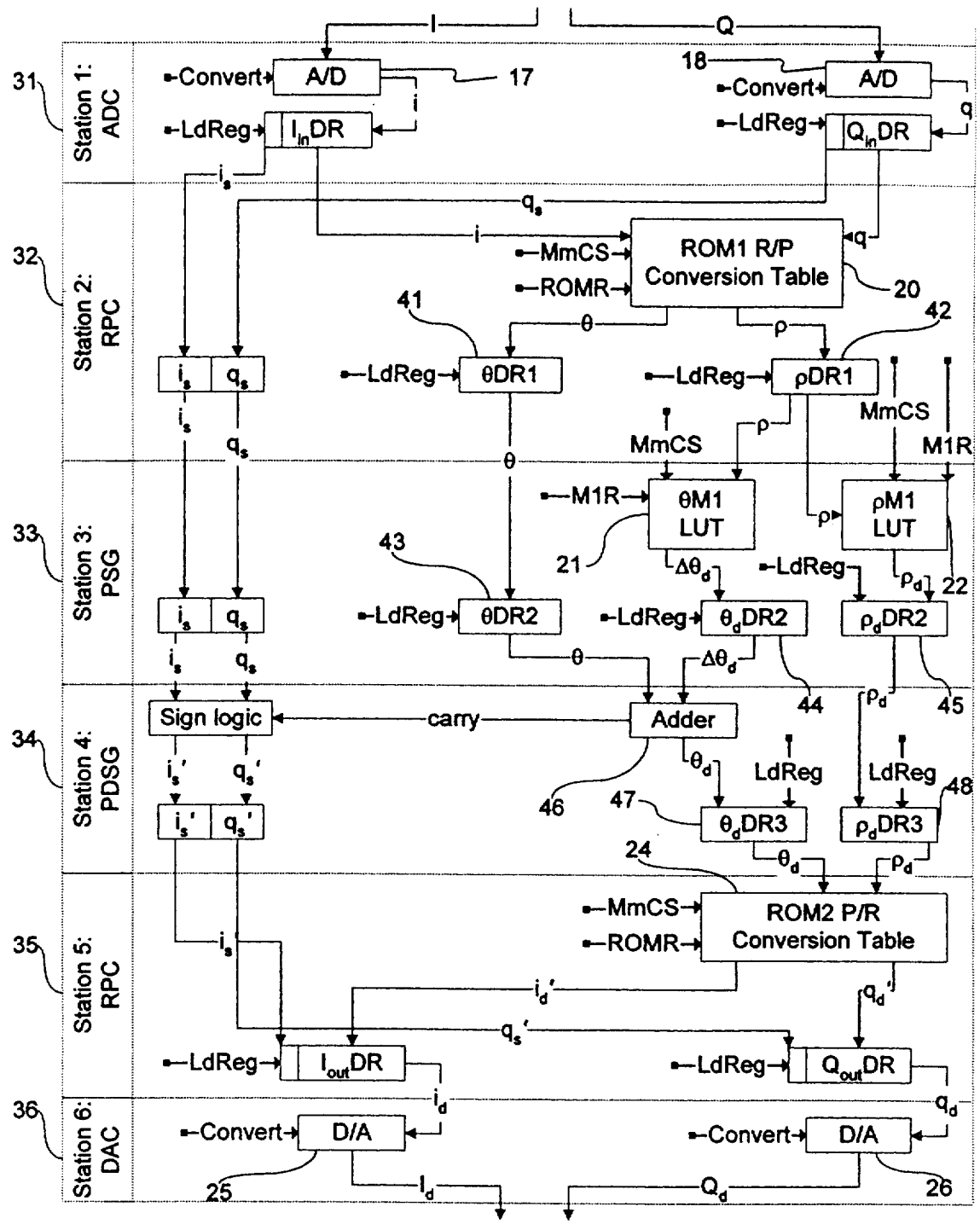
Figure 5:
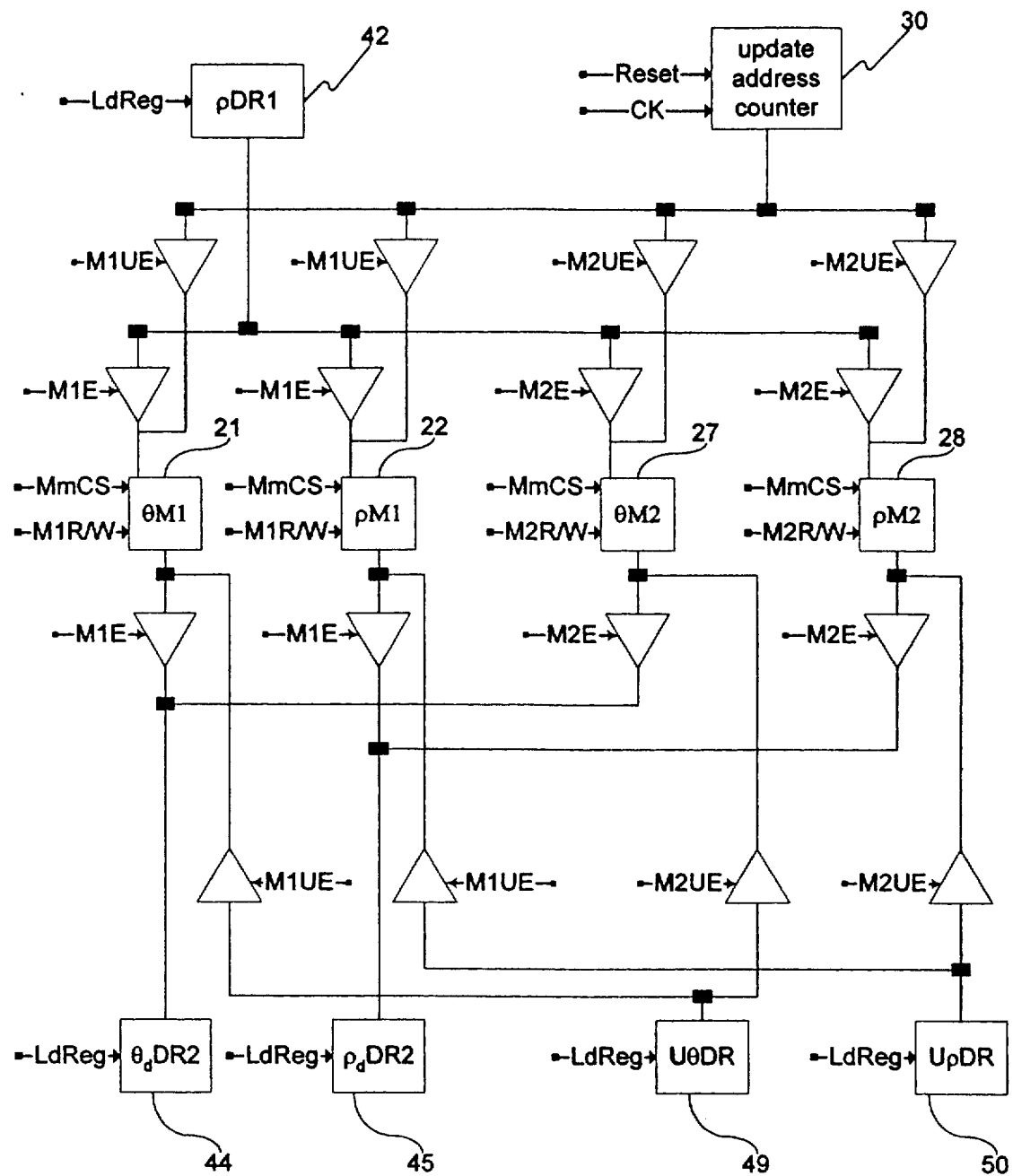
Figure 6:
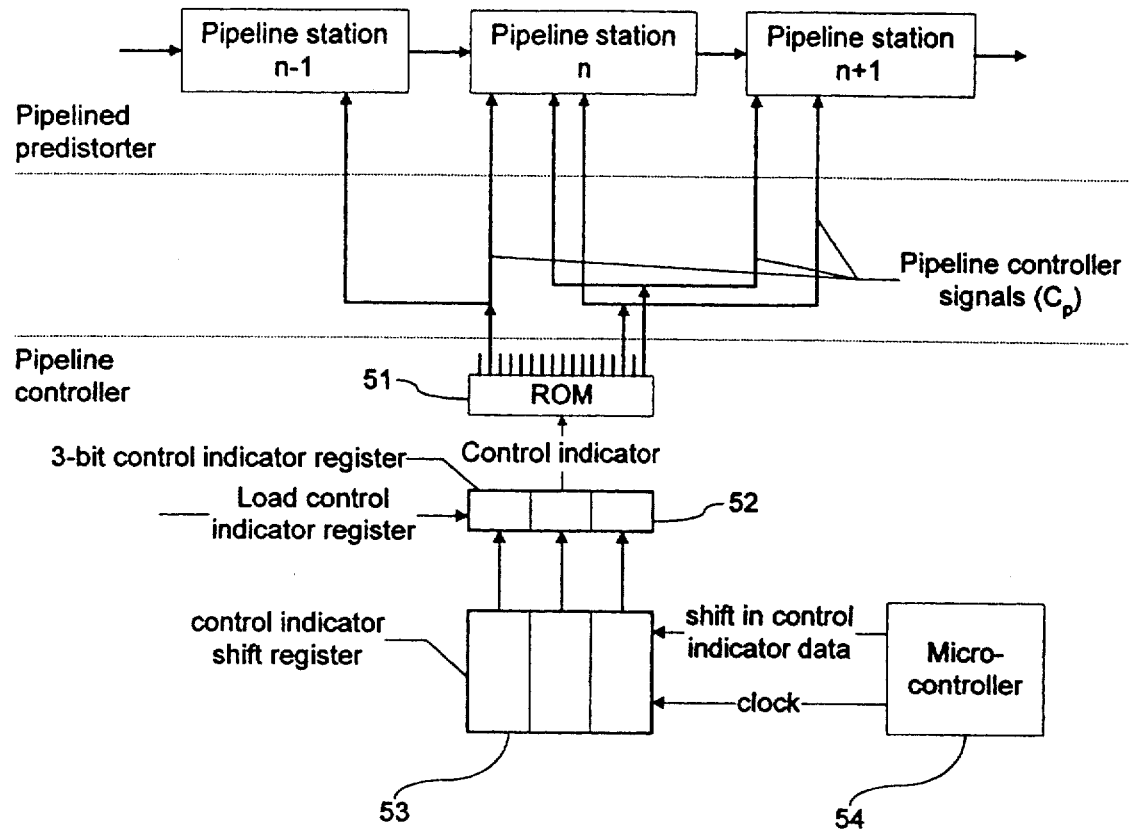
Figure 7:
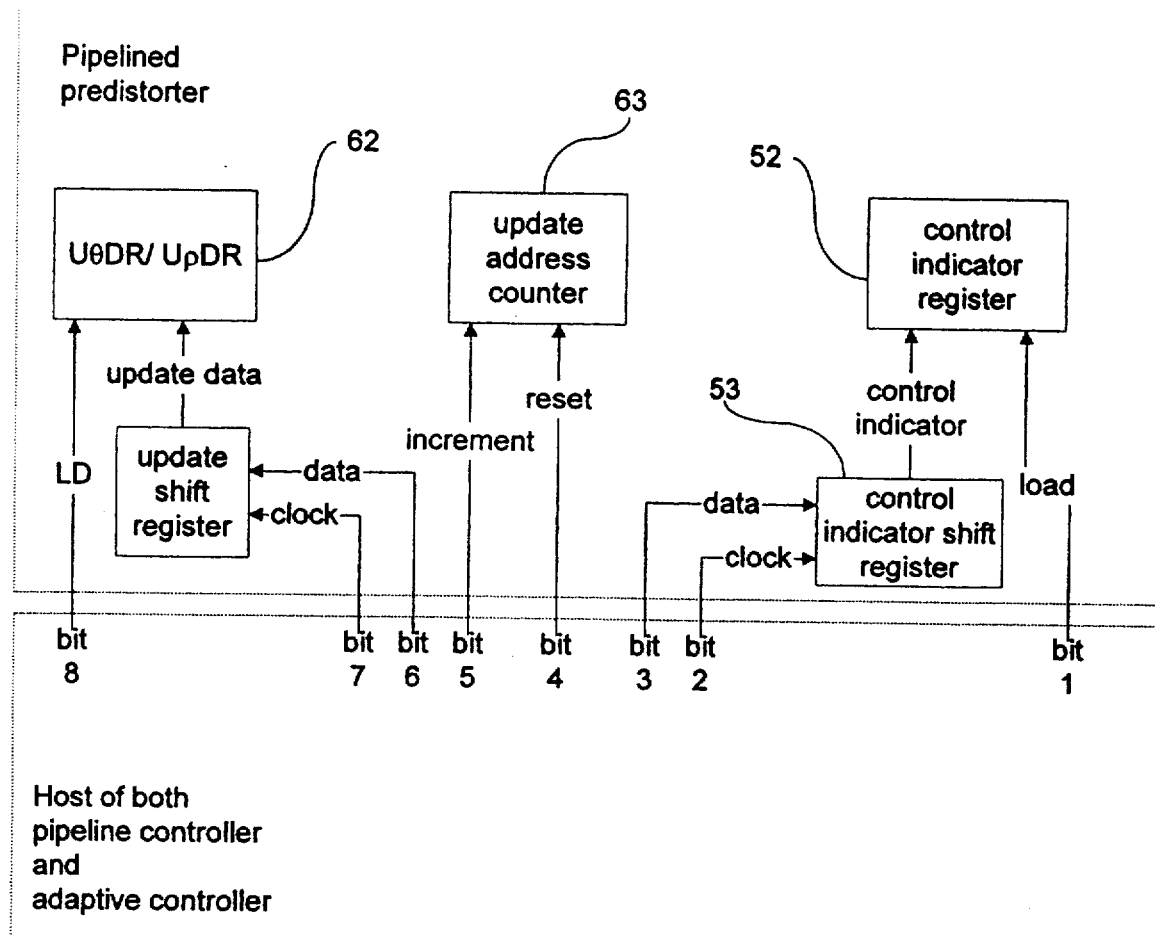

In one embodiment, the adaptive controller (13) and pipeline controller (12) can both be implemented using a single microcontroller. This microcontroller could use an 8-bit parallel port to control the pipelined predistorter (11). FIG. 7 shows a possible 8-bit interface between a microcontroller, implementing both the pipeline and adaptive controllers (12 & 13), and the pipelined predistorter (11). The 3-bit control indicator register (52) receives serial data from the microcontroller. Of the three interface bits, bit 1 carries data, bit 2 is a shift clock, and bit 3 is a load signal. Similarly, bit 6, bit 7 and bit 8 are for loading the update data registers (62). An update address counter (63) is used to provide an address for updating the correction factor look-up tables. The update is performed in sequential order from lower address to higher address. Bit 4 and bit 5 are for resetting and incrementing the update address counter (63), respectively. The data transfer to the idle look-up table is controlled from the microcontroller while the pipelined predistorter (11) is working at its own real-time speed with the active predistortion value look-up table.

In this embodiment, at startup, the microcontroller first applies the reset control signal to initialize the pipelined predistorter (11). The pipelined predistorter (11) resets all data registers and sets the look-up table-set one ready for receiving data from the host. Next, the microcontroller asserts bit 4 to reset the update address counter (63). It then sends a bit-string of one data word to the update data shift register. This bit-string is then transferred in parallel to the data register U$\theta$DR/U$\rho$DR and loaded to table-set one. This completes one data word update cycle. The microcontroller then advances the update address counter (63) by asserting bit 5—the counter increment bit—and starts the next data word update cycle, continuing until all data are loaded into table-set one. When table-set one is fully loaded, the microcontroller applies a pipeline controller signal to start data processing mode.

It is obvious from this description that any digital signal processing method of linearizing the output of an amplifier can be implemented using a pipelined architecture; this approach will always produce a significant increase in the signal bandwidth that can be linearized by a single linearizer, compared to the signal bandwidth that can be linearized using a sequential digital processing architecture.

Although the invention has been described and illustrated with respect to exemplary embodiments thereof, it should be understood by those skilled in the art that the foregoing and various other changes and omissions may be made therein and thereto without departing from the spirit and scope of the present invention.

Having now disclosed the invention, what is claimed is:

1. An apparatus for predistorting analog input signals (S) to be subsequently amplified by an amplifier (16) that otherwise distorts the input signals (S) at the amplifier output, such that the predistorting of the analog input signals reduces the distortion of the amplifier output, comprising:
   a) a pipeline controller (12), for providing pipeline controller signals ($C_p$), and
   b) a pipelined predistorter (11), responsive to the analog input signals (S), and further responsive to the pipeline controller signals ($C_p$), for generating, using digital signal processing, predistorted analog input signals ($S_d$) that compensate for the distortion of the amplifier, wherein the pipelined predistorter includes two or more stations serially connected, each station performing a portion of the digital signal processing used to predistort the input signals (S), and each station acting under the direction of the pipeline controller, concurrently with all the other stations,
whereby digital signal processing is achievable for analog input signals (S) having a bandwidth significantly greater than otherwise achievable in a non-pipelined predistorter.

2. An apparatus, as claimed in claim 1, wherein the analog input signals (S) are an analog I-channel input (I) and an analog Q-channel input (Q), and further wherein the predistorted analog input signals ($S_d$) are a predistorted analog I-channel input ($I_d$) and a predistorted analog Q-channel input ($Q_d$).

3. An apparatus as claimed in claim 2, further comprising:
   a) a quadrature demodulator (14) responsive to a wideband input signal (X), for providing a baseband analog Q-channel input (Q) and a baseband analog I-channel input (I),
   b) a quadrature modulator (15) responsive to the predistorted analog Q-channel input ($Q_d$) and the predistorted analog I-channel input ($I_d$), for providing a predistorted wideband input signal ($X_d$), and
   c) a wideband amplifier (16) responsive to the predistorted wideband input signal ($X_d$), for providing an amplified wideband signal (Y).

4. An apparatus as claimed in claim 3, further comprising an adaptive controller (13) responsive to a feedback ($Y_b$) of the amplified signal (Y), and responsive to a feedforward ($X_f$) of the input signal (X), for providing predistortion values (D) adjusted to account for changes in how the wideband amplifier (16) responds to an input, and for providing adaptive controller signals ($C_a$), and further wherein the pipelined predistorter (11) is responsive to the predistortion values (D) and, indirectly, through the pipeline controller (12), to the adaptive controller signals ($C_a$), and utilizes the predistortion values (D) as commanded by the adaptive controller signals ($C_a$), thereby adapting to changes in how the wideband amplifier (16) responds to an input.

5. An apparatus, as claimed in claim 4, wherein the pipelined predistorter (11) comprises:
   a) a first station (31), responsive to the pipeline controller signals ($C_p$), including an A/D converter (17, 18) for each of the analog input signals (I, Q), each A/D converter further responsive to one of the analog input signals, and each A/D converter providing a sequence of digital input signals (i or q) corresponding to the analog input signal it converts,
   b) a second station (32), responsive to the pipeline controller signals ($C_p$), including an R/P converter (20), responsive to pairs of digital input signals (i, q) associated with the pair of analog input signals (I, Q), for providing, from each pair of digital signals (i, q), which are a rectangular coordinate representation of a signal, a polar coordinate representation in terms of an amplitude signal ($\rho$) and a phase signal ($\theta$),
   c) a third station (33), responsive to the pipeline controller signals ($C_p$), including
      1. a phase difference predistorter (21), responsive to the amplitude signal ($\rho$), for providing a predistorted phase difference signal ($\Delta\theta_d$), and
      2. an amplitude predistorter (22), also responsive to the amplitude signal ($\rho$), for providing a predistorted amplitude signal ($\rho_d$),
   d) a fourth station (34), responsive to the pipeline controller signals ($C_p$), including a phase predistorter (23), responsive to the predistorted phase difference signal ($\Delta\theta_d$), and responsive to the phase signal ($\theta$), for providing a predistorted phase signal ($\theta_d$),
   e) a fifth station (35), responsive to the pipeline controller signals ($C_p$), including a P/R converter (24), responsive to the predistorted phase signal ($\theta_d$), further responsive to the predistorted amplitude signal ($\rho_d$), for providing a predistorted I-channel digital signal ($i_d$) and a predistorted Q-channel digital signal ($q_d$), the I-channel and Q-channel signals being a rectangular representation of the digital signal represented by the predistorted phase signal ($\theta_d$) and the predistorted amplitude signal ($\rho_d$), as a pair, and
   f) a sixth station (36), responsive to the pipeline controller signals ($C_p$), including a D/A converter (25, 26) for each predistorted digital signal ($i_d$, $q_d$), each responsive to one of the predistorted digital signals ($i_d$, $q_d$), and each providing a predistorted analog input ($I_d$, $Q_d$) corresponding to the predistorted digital signal it converts.

6. An apparatus as claimed in claim 5, wherein the predistortion values (D) occur in two versions, one in use by the pipelined predistorter (11), and one in a state of adjustment by the adaptive controller (13).

7. An apparatus as claimed in claim 6, wherein each set of predistortion values (D) is stored in two tables, one for predistorting the phase signal ($\theta$) and one for predistorting the amplitude signal ($\rho$).

8. An apparatus as claimed in claim 7, wherein the adaptive controller (13) continually adjusts one of the sets of tables of predistortion values (D), and, upon completing adjustment of a set of tables, issues a command to the pipeline controller (12) to signal the pipelined predistorter (11) to stop using the active set and to start using the just-adjusted set.

9. An apparatus used for predistorting a wideband analog input signal (S) to be subsequently amplified by an amplifier

(16) that otherwise distorts the input signal (S) at the amplifier output, such that the predistorting of the analog input signal reduces the distortion of the amplifier output, the apparatus comprising:

a) means (14, 17–20), responsive to the pipeline controller signals ($C_p$) and to the analog input signal (S), for generating a phase signal ($\theta$) and an amplitude signal ($\rho$) representing the phase and amplitude of the analog input signal (S), b) means (21, 23), responsive to the pipeline controller signals ($C_p$) and to the amplitude signal ($\rho$) and to the phase signal ($\theta$), for generating a predistorted phase signal ($\theta_d$), c) means (22), responsive to the pipeline controller signals ($C_p$) and to the amplitude signal ($\rho$), for generating a predistorted amplitude signal ($\rho_d$), d) means (24, 25, 26 15), responsive to the pipeline controller signals ($C_p$) and to the predistorted phase signal ($\theta_d$) and to the predistorted amplitude signal ($\rho_d$), for generating a predistorted analog input signal ($S_d$), and e) means (12), communicating with the means of elements a–d, for generating the pipeline controller signals ($C_p$) to cause the concurrent operation of the means of elements a–d.

10. An apparatus, as claimed in claim 9, wherein the means of element a) of claim 9 further comprises:

a) means (17, 18), responsive to the pipeline controller signals ($C_p$) and to the analog input signal (S), for converting the analog input signal (S) into a first digital signal (i) that represents a first quality of the analog input signal, and a second digital signal (q) that represents a second quality of the analog input signal, and b) means (20), responsive to the pipeline controller signals ($C_p$) and to the first and second digital signals (i, q), for generating a phase signal ($\theta$) and an amplitude signal ($\rho$) representing the phase and amplitude of the analog input signal (S).

11. An apparatus for linearizing a wideband amplifier (16), comprising:

a) a pipeline controller (12), for providing pipeline controller signals (Cp), and b) a pipelined predistorter (11), consisting of a plurality of stations (31, 32, 33, 34, 35, 36), serially connected to one another, wherein each station performs one or more digital signal processing tasks, wherein the pipelined predistorter (11) is responsive to an analog input signal (S), and further responsive to the pipeline controller signals ($C_p$) that orchestrate the concurrent operation of each station, for providing predistorted analog input signals ($S_d$), so that the output of the wideband amplifier (16) is approximately a constant factor of the analog input signal (S) and in phase with it.

\* \* \* \* \*

UNITED STATES PATENT AND TRADEMARK OFFICE
CERTIFICATE OF CORRECTION

PATENT NO.    : 5,650,758
DATED         : July 22, 1997
INVENTOR(S)   : Xiangqing Xu, et al It is certified that error appears in the above-identified patent and that said Letters Patent is hereby corrected as shown below:

The title page should be deleted and substitute therefor the attached title page.

IN THE DRAWINGS

Delete Drawing Sheets 1-7, and substitute therefor the drawing sheets consisting of FIGS. 1-7, as shown on the attached pages.

Column 13, line 18 (claim 9) "d) means (24,25,26 15), should read --d) means (24,25,26,15),--

Signed and Sealed this

Seventh Day of October, 1997

BRUCE LEHMAN

*Attest:*

*Attesting Officer*      *Commissioner of Patents and Trademarks*

United States Patent [19]

Xu et al.

[11] Patent Number: 5,650,758
[45] Date of Patent: Jul. 22, 1997

[54] PIPELINED DIGITAL PREDISTORTER FOR A WIDEBAND AMPLIFIER

[75] Inventors: Xiangqing Xu, Corvallis; James H. Herzog, Monmouth; Robert S. Larkin, Corvallis, all of Oreg.

[73] Assignee: Radio Frequency Systems, Inc., Marlboro, N.J.

[21] Appl. No.: 563,613

[22] Filed: Nov. 28, 1995

[51] Int. Cl.$^6$ ............................................. H03F 1/26
[52] U.S. Cl. ............................................. 330/149
[58] Field of Search .................... 330/107, 129, 330/149, 151; 332/123, 124, 159, 160

[56] References Cited

U.S. PATENT DOCUMENTS

| | | | |
|---|---|---|---|
| 5,123,031 | 6/1992 | Kuisma | 375/60 |
| 5,266,906 | 11/1993 | Inahashi | 330/149 |
| 5,351,016 | 9/1994 | Dent | 332/123 X |
| 5,485,120 | 1/1996 | Anvari | 330/149 X |

FOREIGN PATENT DOCUMENTS

2239770   7/1991   United Kingdom .

OTHER PUBLICATIONS

"Adaptive Linearisation Using Pre-Distortion" by Michael Faulkner, IEEE CH 2846-Apr. 1990, pp. 35-40.

"Linear Amplication for Digital Mobile Communications" by Yoshinori Nagata, IEEE CH 2379-Jan. 1989, pp. 159-164.

"Digital Modulation/Demodulation Techniques for Mobile Radio Communications in Japan", The Transactions of the Institute of Electronics & Communications Engineers of Japan, Section E., vol. E74 No. 6, Jun. 1991, pp. 1503-1511, Tokyo, Japan.

*Primary Examiner*—Steven Mottola
*Attorney, Agent, or Firm*—Ware, Fressola, Van Der Sluys & Adolphson LLP

[57] ABSTRACT

An apparatus for linearizing the output of a wideband amplifier by digitally predistorting the input to the amplifier in a way that just compensates for the distortion in the amplified signal, comprising a pipeline controller (12), for providing pipeline controller signals, and a pipelined predistorter (11), consisting of several stations, serially connected to each other, wherein each station performs one or more tasks concurrently, under the direction of the pipeline controller (12). The result is a digital predistorter with a bandwidth large enough to linearize, by itself, the entire output of a wideband amplifier. More generally, an apparatus for linearizing a wideband amplifier by using digital signal processing performed using a pipeline architecture, as opposed to using a sequential processing architecture, under the supervision of a pipeline controller.

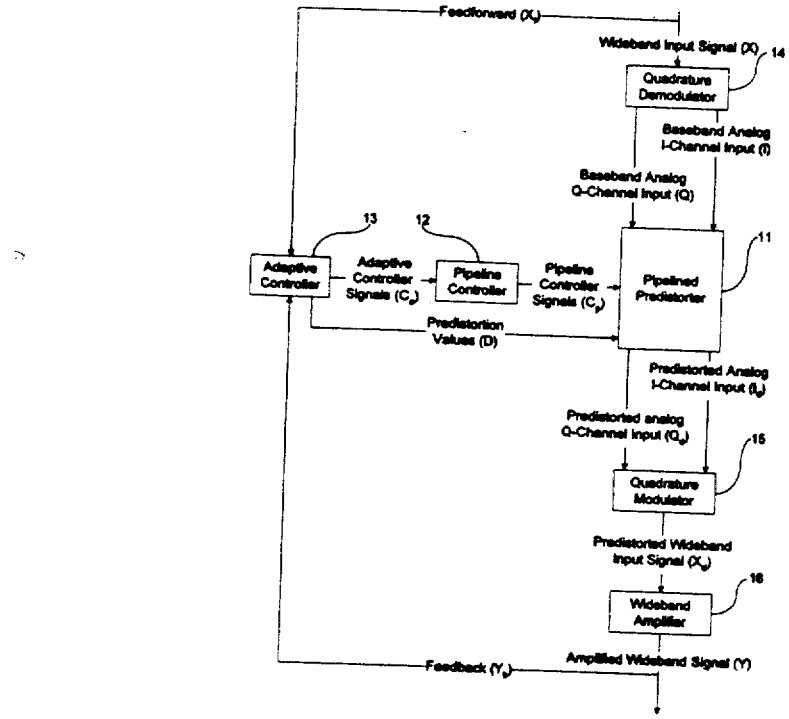

11 Claims, 7 Drawing Sheets